United States Patent [19]

Vissiere

[11] Patent Number: 4,800,264
[45] Date of Patent: Jan. 24, 1989

[54] MANUALLY CONTROLLED STATIC SWITCH

[75] Inventor: Daniel Vissiere, Villefranche de L., France

[73] Assignee: VCL Audio, Vezenobres, France

[21] Appl. No.: 129,899

[22] Filed: Dec. 7, 1987

Related U.S. Application Data

[63] Continuation of Ser. No. 842,657, Mar. 21, 1986, abandoned.

[30] Foreign Application Priority Data

Apr. 1, 1985 [FR] France ................. 85 05489

[51] Int. Cl.$^4$ ............... H03K 17/94; H03K 17/969
[52] U.S. Cl. ................. 250/221; 340/644; 341/31
[58] Field of Search ........... 250/221, 229; 307/311; 340/365 P, 286 M, 644

[56] References Cited

U.S. PATENT DOCUMENTS

| | | | |
|---|---|---|---|
| 3,398,290 | 8/1968 | Basehore et al. | 250/221 |
| 4,222,111 | 9/1980 | Sloan et al. | 340/286 R |
| 4,278,870 | 7/1981 | Carleton et al. | 250/221 |
| 4,311,990 | 1/1982 | Burke | 250/221 |

FOREIGN PATENT DOCUMENTS

| | | |
|---|---|---|
| 16267 | 2/1978 | Australia . |
| 0057446 | 8/1982 | European Pat. Off. . |
| 2723398 | 11/1978 | Fed. Rep. of Germany . |
| 3146152 | 6/1983 | Fed. Rep. of Germany . |

Primary Examiner—Edward P. Westin
Assistant Examiner—Charles F. Wieland
Attorney, Agent, or Firm—Oblon, Fisher, Spivak, McClelland & Maier

[57] ABSTRACT

The invention relates to a manually controlled static switch. This switch comprises a body having a slot with a base wall, bordered on either side by first and second recesses, so that the slot has at least two walls transparent to electromagnetic radiation positioned laterally with respect to the base wall and which are substantially parallel to one another, an electromagnetic radiation beam emitter disposed in the first recess, so as to be able to supply beams to said second recess, a radiation—sensitive receiver located in the second recess and which detects the beams, the receiver emitting an output signal having two different levels depending on whether the receiver does or does not receive the beam. The base wall is made from a transparent material and the switch also comprises a visible light source positioned behind the base wall of the slot and oriented so as to illuminate the interior of the slot through the base wall and means for controlling the source as a function of the value of the output signal of the sensitive receiver.

Application to static switches.

6 Claims, 2 Drawing Sheets

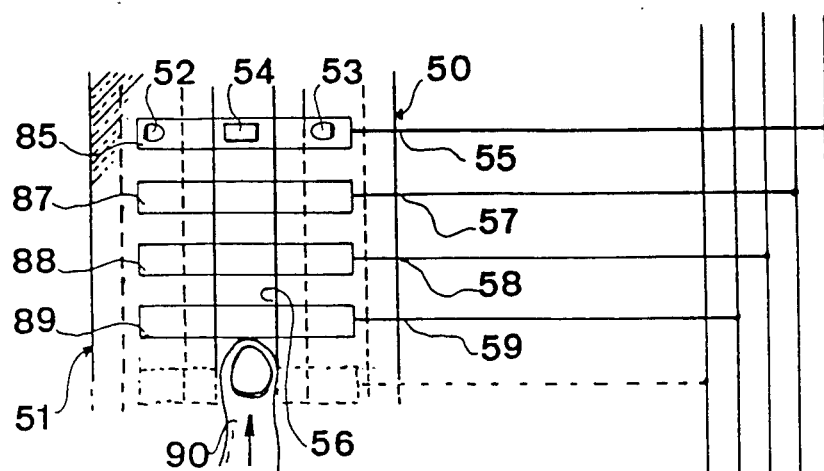
FIG. 3
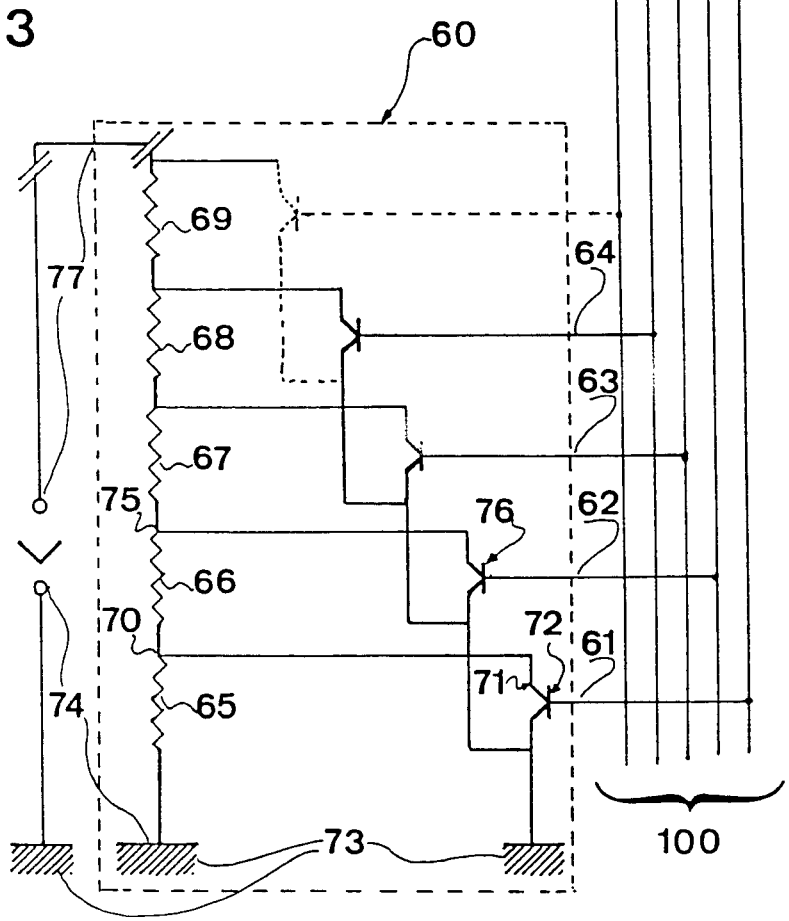

MANUALLY CONTROLLED STATIC SWITCH

This application is a continuation of application Ser. No. 842,657, filed on Mar. 21, 1986, now abandoned.

BACKGROUND OF THE INVENTION

The present invention relates to manually controlled static switches, i.e. any device making it possible to supply at at least one output terminal a signal able to assume at least two levels, one of the two levels being obtained on e.g. manually applying an element to a given location. It also applies to the application of these switches to the sequential control of elements, e.g. electronic elements, as a function of a given position of a preferably manually displaceable element.

Switches of the aforementioned type already exist, which can be manually controlled. They are generally provided, beneath a flexible wall, with two facing contacts subject to the action of recoil spring means, e.g. made from a material which does not conduct electricity. In order to control such a switch, it is merely necessary, e.g. through the direct or indirect action of a finger, to exercise a slight pressure on the flexible wall in order to bring into contact the two contacts, which then establish the switching function, e.g. for closing a circuit. Although this system gives good results, it still requires use precautions, because excessive pressure forces could lead to the more or less rapid destruction of the contacts, particularly in special applications, such as e.g. the control of different musical elements in theatres, concert halls and the like, where the means are often subject to rough handling.

There are also other completely static switches, which generally comprise an electromagnetic wave beam source with a cell for receiving the beams located at a certain distance from the source, so as to permit the passage between them of an element, such as e.g. the finger of a hand.

These devices adequately fulfil the functions required. However, in the case of an application such as to a control potentiometer in an audio mixer, they may suffer from two disadvantages. Firstly the user does not have the touch sensation, which is necessary e.g. in the case referred to hereinbefore and secondly he does not know at precisely which point he has placed his finger.

SUMMARY OF THE INVENTION

Thus, the object of the present invention is to provide a reliable and advantageously manually controllable static switch making it possible to give potential users touch sensations, so that they also know if switching has taken place and more particularly which switching has taken place in a multiswitching system.

More specifically the present invention relates to a manually controlled static switch comprising a body, said body having at least one slot with a transparent base wall, said slot being bordered on either side by first and second recesses, so that said slot has at least two walls transparent at least to electromagnetic radiation positioned laterally with respect to the base wall and which are substantially parallel to one another, at least one emitter of beams of said electromagnetic radiation located in the first recess, so as to supply said beams to said second recess, a receiver sensitive to said electromagnetic radiation located in the second recess and positioned so as to be able to detect said beam emitted by said source, said receiver being able to emit an output signal having at least two different levels depending on whether the receiver receives or does not receive the said beam, a visible light source positioned behind the base wall of said slot and oriented so as to illuminate the interior of said slot through said base wall and means for controlling said source as a function of the value of said output signal of said sensitive receiver.

BRIEF DESCRIPTION OF THE DRAWINGS

The invention is described in greater detail hereinafter relative to non-limitative embodiments and the attached drawings, wherein show:

FIG. 3 In diagrammatic partial form, an embodiment of a switch according to the invention in a particular application, namely the control of a potentiometer, whereof the values of the variations are in increments.

DETAILED DESCRIPTION OF THE PREFERRED EMBODIMENTS

Figure 1:
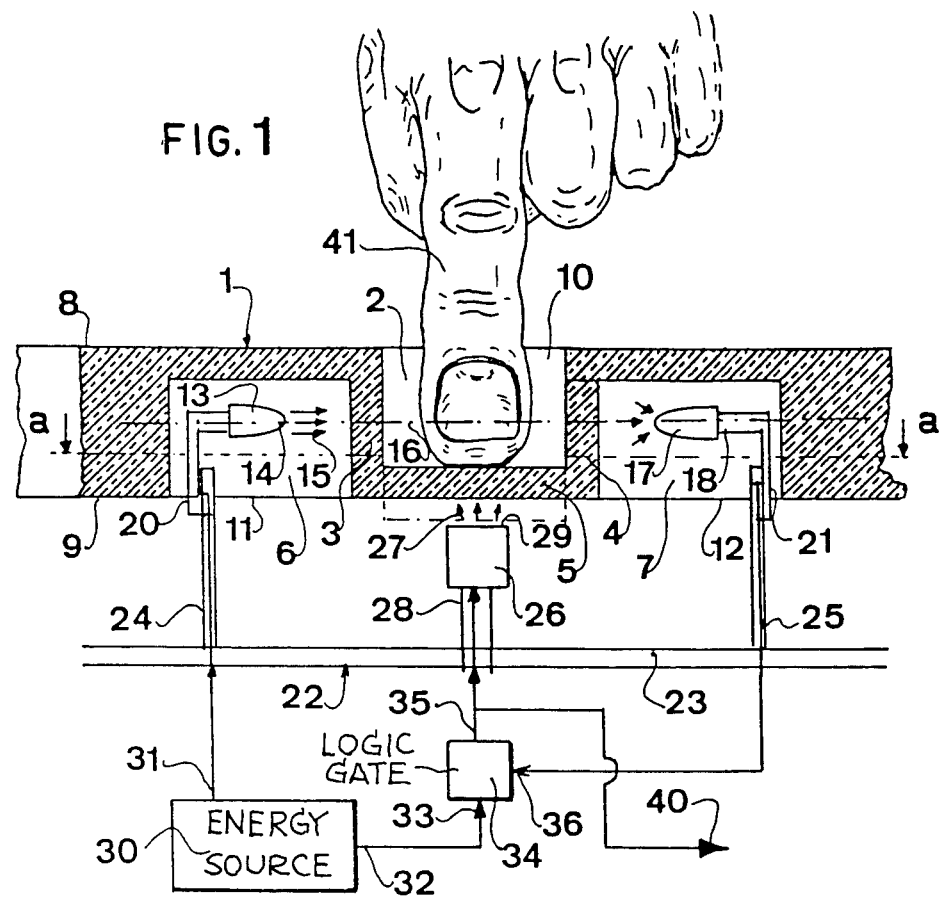
FIGS. 1 and 2 Two-different perpendicular sectional views of the same embodiment of a switch according to the invention.
Figure 2:
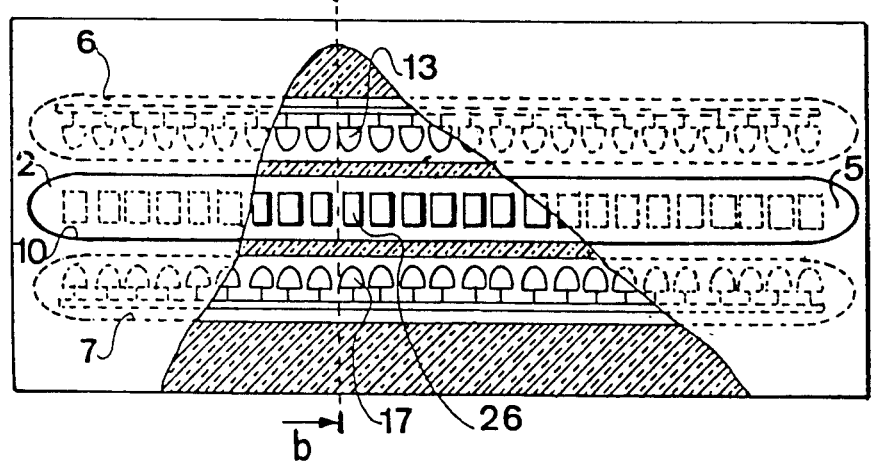

FIGS. 1 and 2 show the same embodiment and consequently implies that the same references designate the same means. FIG. 1 is a sectional view along b—b of FIG. 2 and FIG. 2 is a view along a—a of FIG. 1.

The illustrated device relates to a static switch, as defined in the introduction to the description, said switch being manually controllable, notably by applying a finger, as is diagrammatically shown in FIG. 1.

More specifically, the switch comprises a body 1, which is preferably made from a transparent material, such as e.g. a plastics material, in which are provided a slot 2 and two recesses 6, 7. Slot 2 is laterally defined by two walls 3, 4 and by a base 5, the two preferably parallel walls, 3, 4 separating slot 2 respectively from the two recesses 6, 7. Body 1 is substantially planar and is defined by two substantially parallel faces 8, 9. Therefore and in this embodiment, the opening 10 of slot 2 is on face 8 of body 1, whilst the two recesses 6, 7 have their respective opening 11, 12 turned towards face 9.

Slot 2 and the two recesses 6, 7 formed in this board or plate-like body 1 are produced in such a way that the thickness of the side walls 3, 4, and the base wall 5 is sufficient to be able to resist pressures which can be exerted by a finger, even involving a significant strength, but are still sufficiently thin to enable a visible electromagnetic wave beam, e.g. of approximately 6000 Angstrom, or a non-visible electromagnetic wave beam of e.g. 10,600 Angstrom to pass through said material without undergoing a significant attenuation. As we explained hereinafter, in an advantageous embodiment, said radiation will be chosen in the invisible range, such as e.g. that emitted by a GaAs laser diode.

The switch has at least one electromagnetic wave emitter 13 positioned in recess 6, in such a way that its emitting surface 14 is able to emit the electromagnetic wave beam 15 on optical axis 16 which, as shown in FIGS. 1 and 2, is substantially perpendicular to the two side walls, 3, 4 which, are advantageously parallel, so that in this way the optical axis passes substantially through the centre of the other recess 7 and consequently also the centre of slot 2. Therefore, when emitter 13 emits its beam 15, the latter can propagate along axis 16 traversing the two side walls 3, 4 and drops into recess 7 if there is no obstacle in slot 2.

In the second recess 7 is located on optical axis 16 a receiver 17 which is sensitive to the electromagnetic radiation emitted by emitter 13. This sensitive receiver 17 is able to supply at its output or outlet 18 a generally electrical signal, whose amplitude value is a function of the electromagnetic wave quantity received by its sensitive surface and is able to supply a signal at at least two levels depending on whether or not receiver 17 receives said electromagnetic wave beam emitted by emitter 13.

Obviously, these two components, emitter 13 and receiver 17 are e.g. disposed respectively by means of their joining clips 20, 21, on a printed circuit board 22, which is in this embodiment U-shaped with a bottom part 23 and two side parts 24, 25. Side part 24 serves as a support and for connecting to the output terminals 20 of emitter 13, whilst side part 25 serves as a support for the output terminals 21 of the sensitive receiver 17. Board 23 ensures the connections between the different elements, as well as the emitter and receiver, and possible external elements, such as e.g. fixing clips to other elements.

Beneath the base wall 5 of slot 2 with respect to the interior of the latter is located a source 26 of visible light 27. Source 26 is positioned e.g. by means of its connecting terminals 28 on the board 23 of printed circuit 22, so that its emission surface 29 is turned towards the base wall 5 and the beams 27 emitted by said source 26 can pass through said base wall 5 and can be seen by an observer located above the opening 10 of said slot 2.

The switch as illustrated in FIG. 1 also has an energy source 30 having the number of terminals necessary for supplying all three active elements, in the present case emitter 13, receiver 17, and source 26. This energy source 30 comprises a first output terminal 31, which is connected to the connecting terminals 20 of emitter 13, a second output terminal 32 connected to a first input 33 of a logic gate 34, whose output 35 is connected to the connecting terminals 28 of the visible light source 26. Logic gate 34 has a control input 36 connected to the output terminals 21 of the sensitive receiver 17. These connections take place in a very conventional manner by means of printed circuits presently available in the electronic field.

The function of logic gate 34 is such that when the sensitive receiver 17 receives a light signal from emitter 13, it supplies at its output 18 an electric signal, whose level is adapted in such a way that, when applied to the input 36 of logic gate 34, the latter constitutes a switch permitting a non-supply of light source 26, which is then unable to emit its visible light beam 27. In this case, logic gate 34 is in a so-called "non-conducting" state. However, when receiver 17 does not receive the beams 15 emitted by emitter 13, the output signals supplied by it at its output 18 is applied to the input 36 of logic gate 34 and enables the light source 26 to be supplied, so that it can emit its visible light beams 27 and in this case the logic gate 34 is said to be in a "conducting" state.

What has been described hereinbefore with more particular reference to FIG. 1 represents the basic diagram of a one position switch, i.e. at output 35 of logic gate 34 and more particularly at terminal 40, an analog 0–1 signal is obtained depending on whether, as illustrated in FIG. 1, there is or is not an element in slot 2, such as e.g. the finger 41 of a user. Thus, the switch makes it possible to obtain at output 40 the signal as defined hereinbefore in the introduction to the present description.

The above device functions in the following way. It is conceivable that one wishing to obtain a signal at output 40, a user positions his finger 41 on the bottom 5 of slot 2 and presses strongly or not on said wall. The force with which he presses has no significance, due to the rigidity of the base wall 5, which is not liable to deform, so that the device consequently has all the conditions necessary for a long life. When the user positions his finger 41 in slot 2, he interrupts the electromagnetic beam 13, which cannot drop onto the sensitive surface of receiver 17. As stated hereinbefore, the latter supplies a signal able to make logic gate 34 conductive. Light source 26 is then supplied and emits a light beam 27, at the same time as a signal, which can be used for different applications, appears at the output 40.

Thus, the advantages of such a device are apparent and makes it possible to cumulatively be manually controlled by a potential user, who will not fear pressing on the bottom 5 of slot 2, because this has no mechanical effect. The user will also have the sensation of having pressed on a key or button in the manner in which he is accustomed to do for other elements of the same type. Finally, with this system, he will be certain to know that he has indeed controlled the switch because, only when he has positioned his finger 41 in slot 2 will the light source 26 be illuminated. This shows the interest of using a non-visible light emitter 13 so as not to interfere with that of source 26.

FIG. 2 shows the same embodiment as FIG. 1. However, in this case, it can be seen that the switch can have a plurality of assemblies comprising, as hereinbefore, body 1, emitter 13, receiver 17 and source 26, the three latter being located essentially in the same plane. The assemblies will be positioned parallel to one another, so that a user who has positioned his finger in slot 2, which is in this case oblong, can on the one hand move it easily and on the other known instantaneously the position which he has adopted, because the different light sources 26 will be illuminated as a function of the finger position.

FIG. 2 shows a plurality of assemblies associated in linear manner, which can be used in different applications and more particularly in potentiometric controls, on the standard audio mixers used in the musical field, for recording or for sound playback for shows.

FIG. 3 shows a switch 50 permitting stepwise controls of a potentiometer 60. Switch 50 comprises, in a single body 51, advantageously completely made from a transparent material, a plurality of assemblies 85, 87, 88, 89 etc. as described hereinbefore, each formed from linked elements, particularly an emitter 52, receiver 53, light source 54, together with an output 55. The different juxtaposed assemblies 85, 87, 88, 89 etc. are positioned in such a way that a single slot 56 passes linearly between the emitter - receiver pairs and facing light sources. Thus, by e.g. moving a finger 90 along slot 56, e.g. logic signals will appear on the different outputs 55, 57, 58, 59 etc. permitting the identification of the finger position in slot 56. The outputs 55, 57, 58 ,59 etch of switch 50 are connected to the corresponding inputs 61, 62, 63, 64 etc. of potentiometer 60. The connecting means between these outputs and inputs are generally constituted by a bus line 100.

The potentiometer is constituted by a row of series-connected resistors 65, 66, 67, 68, 69, etc. Each common connecting point between two consecutive resistors is e.g. connected to a reference potential, such as earth, across the emitter - receiver circuit of a transistor. The type and connecting direction of the transistors illustrated in FIG. 3 have not been defined, because this technology is well known and the expert will be able to choose the appropriate transistor type and its connecting direction.

For example the common point 70 between two resistors 65 and 66 is connected by the emitter - receiver circuit 71 of transistor 72 to earth 73. The end 74 of the row of resistors is also directly connected to earth 73. This obviously also applies for the other points of consecutive resistors, e.g. point 75 between two resistors 66, 67, which is connected to earth 73 across transistor 76 and so on for the other common points. The other end 77 of the group of resistors forms with the end 74 the two use terminals of potentiometer 60. These two terminals can then be connected to a circuit, like that designated V in FIG. 3.

The combination of switch 50 with potentiometer 60 functions in the following way. It is firstly assumed that a user e.g. wishes to vary a sound level for a musical application in connection with a show. In order to obtain such a level variation, it is known that it is necessary to vary the value of an electrical signal, e.g. by means of a potentiometer. Thus, in the case illustrated in FIG. 3, the user will pass the end of his finger 90 into slot 56 whilst moving it along the same, if this is necessary. As a result of this movement, the different outputs 55, 57, 58, 59 will supply a signal identified as a function of the finger position in slot 56. As stated hereinbefore, it is pointed out that the user knows the point in the slot where he has positioned his finger by the fact that the light source will be illuminated on this position and he can see the light through the bottom of slot 56. If he wishes to control a certain value of the potentiometer resistance, he positions his finger at the point n the slot which has been previously marked for a given resistance value.

For example, if he positions his finger level with assembly 59, a signal is obtained at output 59 and is transmitted by bus line 100 so as to be applied to input 64. This makes the associated transistor conductive, so that all the resistors 68, 67, 66, 65 are short-circuited and the resistance value of the potentiometer is equal to the value of resistor 69 alone.

However, by positioning his finger level with assembly 85, the signal supplied at output 55, applied to transistor 72 will lead to the short-circuiting of resistor 65 and the potentiometer resistance value will be equal to the sum of resistors 66, 67, 68, 69 etc.

Now, if the user wishes to obtain a substantially continuous variation (at least stepwise), he can move his finger along slot 56 and the total resistance value of potentiometer 60 will have a variation corresponding to each passage with respect to assemblies 85, 87, 88, 89, etc. with, as a function of the finger movement direction, the addition or substraction of one of the resistors 65, 66, 67, 68, 69, etc.

It is pointed out that the described embodiment has been given in a non-limitative manner and that the switch could also have a larger number of assemblies 85, 87, 88, 89 and consequently e.g. control a variation of the potentiometer by smaller and/or larger values.

What is claimed is:

1. A manually controlled static switch comprising a body which has at least one oblong slot with a base wall, said slot being bordered on either side by first and second oblong recesses, so that said slot has at least two walls transparent to electromagnetic radiation, positioned laterally of the base wall and substantially parallel to one another, the body being constituted by a plate defined by two substantially parallel faces, said slot issuing by one opening onto a first face and the two recesses issuing by an opening onto the second face, a plurality of juxtaposed electromagnetic radiation beam emitters for emitting a first electromagnetic radiation located in the same first recess, a plurality of juxtaposed receivers located in the same second recess, the two recesses and the slot being located on substantially parallel axes, whereby with each emitter is associated a sensitive receiver, said receiver being able to emit an output signal having at least two different levels as a function of whether the receiver does or does not receive said beam when said beam is interrupted, wherein said base wall is made from a transparent material and said switch also comprises a plurality of juxtaposed light sources of a second electromagnetic radiation in the visible range positioned behind the base wall of said slot respectively corresponding to the emitters and receivers and oriented so as to illuminate the interior of said slot through said base wall and means connected to the outputs of the receivers for controlling each of said sources as a function of the level of said output signal of the sensitive receiver corresponding to this source; said body being made from a material transparent to the first electromagnetic radiation.

2. A switch according to claim 1 wherein emitters, receivers and light sources are integral with a circuit board which is substantially U-shaped and has a bottom part substantially parallel to said second face and two side parts respectfully facing the two recesses, emtters and receivers being respectively mounted on the two side parts and said light sources, on the bottom part, between the two side parts and facing the slot.

3. A switch according to claim 2, wherein each emitter, the receiver associated with each emitter and the light source controlled by said receiver are essentially located on the same plane.

4. A switch according to claim 2, wherein the outputs of the sensitive receivers are connected to a control input of a potentiometer.

5. A switch according to claim 3, wherein the electromagnetic wave emitter is an invisible light source.

6. A switch according to claim 5, wherein the invisible light source is an infrared light source.

* * * * *